United States Patent
Wylie et al.

(10) Patent No.: US 9,322,865 B2
(45) Date of Patent: Apr. 26, 2016

(54) METHOD FOR DETECTION OF LEAKAGE OR FAULT CURRENTS FROM EQUIPMENT IN AN ELECTRICAL POWER SYSTEM

(75) Inventors: Timothy Andrew Wylie, New Lambton (AU); Ian Webster, Eleebana (AU); Peter Stepien, Elermore Vale (AU)

(73) Assignee: AMPCONTROL PTY LTD., Tomago (AU)

( * ) Notice: Subject to any disclaimer, the term of this patent is extended or adjusted under 35 U.S.C. 154(b) by 339 days.

(21) Appl. No.: 13/702,664

(22) PCT Filed: Jun. 7, 2011

(86) PCT No.: PCT/AU2011/000705
§ 371 (c)(1),
(2), (4) Date: Jun. 5, 2013

(87) PCT Pub. No.: WO2011/153581
PCT Pub. Date: Dec. 15, 2011

(65) Prior Publication Data
US 2013/0258537 A1    Oct. 3, 2013

(30) Foreign Application Priority Data
Jun. 7, 2010    (AU) .............................. 2010902478

(51) Int. Cl.
*G01R 31/02* (2006.01)
*H02H 3/08* (2006.01)
*G01R 19/25* (2006.01)
*H02H 3/46* (2006.01)
*H02H 3/50* (2006.01)

(52) U.S. Cl.
CPC .............. *G01R 31/025* (2013.01); *G01R 19/25* (2013.01); *G01R 19/2506* (2013.01); *H02H 3/08* (2013.01); *H02H 3/46* (2013.01); *H02H 3/50* (2013.01)

(58) Field of Classification Search
CPC .. G01R 19/25; G01R 19/2506; G01R 31/025; H02H 3/08; H02H 3/46; H02H 3/50
USPC ........................................................... 361/87
See application file for complete search history.

(56) References Cited

U.S. PATENT DOCUMENTS 5,872,457 A    2/1999  Williams
6,518,769 B1 *    2/2003  Ammon et al. ............... 324/534

* cited by examiner

*Primary Examiner* — Thienvu Tran
*Assistant Examiner* — Kevin J Comber
(74) *Attorney, Agent, or Firm* — Galgano & Associates, PLLC; Thomas M. Galgano; Jessica G. McDonald

(57) ABSTRACT

A method of digital sampling of a current or group of currents in an electrical system including using in the sampling, sufficient bandwidth to reconstruct the amplitude and phase of a synthesized power frequency and its harmonics and a fundamental carrier frequency of switching electronics and modulation sidebands.

26 Claims, No Drawings

METHOD FOR DETECTION OF LEAKAGE OR FAULT CURRENTS FROM EQUIPMENT IN AN ELECTRICAL POWER SYSTEM

BACKGROUND

The present invention relates to protection of electrical systems and more particularly relates to a method of measurement, analysis and discrimination of signals for the purpose of determining leakage and/or fault currents in electrical devices supplied by such systems. The invention also relates to the identification of frequency components of currents in electrical systems. The invention further relates to methods of detection of high frequency current earth faults and leakages in particular though not exclusively in I-T (isolated terra and/or earth fault limited) supply networks and particularly supply networks in hazardous areas such as but not limited to mines. The invention also relates to a method of improving the reliability of relays in determining earth leakage faults and particularly when the relays are operating in association with switching power electronics, including but not limited to variable speed drives. The invention further relates to a method for interpreting wide bandwidth measurement signals to flag potential hazards that may result from operation of switching electronics rather than rejecting such signals as noise to simplify analysis. The method includes real-time analysis of signals from multiple transducers or measurement points to provide fault diagnostic and location information in I-T supply networks.

PRIOR ART

Earth leakage devices are a crucial component in electrical safety and are frequently also required by regulation. Earth leakage protection is intended to improve safety without causing unwanted and unnecessary disruptions to the electrical system to which the earth leakage safety device is connected. Earth leakages and fault currents in electrical installations can, in a worst case, cause electrocution and/or give rise to arcing. Unlike circuit breakers that detect overload current, and then isolate the electrical system to which the breaker is attached, earth leakage devices are primarily used for protecting personnel from electrocution. An overload circuit breaker is designed to interrupt a circuit when the current exceeds a preset limit. As the current necessary for fatal electrocution is less than several Amperes for a duration of less than several seconds, an overload circuit breaker offers virtually no protection from electrocution. Earth leakage protection devices are typically designed to trip on fault currents of between 10 and 100 mA and for interrupt times between 40 and 100 milliseconds after a fault current is sensed. Earth leakage devices are based on the principle that the amount of current entering a device via the supply lines should be exactly the same as the amount of current leaving the device via the supply lines and that any discrepancy is due to current leakage and/or uncontrolled branching of current to the cabled and/or physical earth.

If there is a fault in the wiring of an electrical appliance that allows the exposed body of the appliance to become connected to a live active source, a person in contact with the live appliance may be electrocuted since the contact provides a parallel path to earth for the current instead of via the neutral or other supply lines. This is the situation for which an earth leakage protection device is employed. A circuit breaker will not typically react to a small, albeit fatal, additional current flowing.

In an earth leakage protection device an earth leakage current is sensed by comparing the active and neutral currents flowing through a circuit, usually by the simple means of measuring the current induced in a coil through which both of the wires have been passed. Under normal conditions, there will be equal and opposite currents flowing in the active and neutral conductors respectively, and hence no current induced in the coil. The sensing technique is equally applicable to a three phase system (with or without a neutral connection) where all of the load current delivered via the phase bundle should return via the same phase bundle. The current induced in the coil by unbalanced supply and return active and neutral current due to a fault condition to the cabled and/or physical earth can be used to trigger an interruption to the circuit using switchgear or a relay.

Not all electrical systems are protected by earth leakage devices. Such devices are relatively expensive and can be subject to unwanted (nuisance) tripping, as there can be circumstances where there may be an imbalance between the active and neutral currents without any safety implications. This is particularly true for systems that include loads containing switching power electronics with common mode noise suppression filtering. In such loads, some level of earth leakage current is normal, not necessarily indicative of a fault and often does not pose an electrocution hazard. The fact that such loads generate a leakage current under normal, no fault conditions complicates detection of an actual earth leakage fault as well as what level of leakage current is acceptable. Generally a compromise is reached between safety and operational reality in determining the extent of use of earth leakage devices, and/or the leakage current level that will be allowed to flow prior to initiating a protection trip.

Nuisance tripping can be minimised by utilising separate earth leakage protection devices for individual pieces of equipment to be so protected. In such instances, the earth leakage tripping thresholds can be optimised for individual devices. A more cost-effective alternative may be to place devices with known leakage on to a circuit which has an earth leakage protection device with higher activation threshold.

Regulations for earthing (grounding) systems vary considerably among different countries. A protective earth connection ensures that all exposed conductive surfaces are at the same electrical potential as the surface of the Earth, to avoid the risk of electrical shock if a person touches a device in which an insulation fault has occurred. It ensures that in the case of an insulation fault a high current will flow that will trigger an over current protection device such as a fuse or circuit breaker, thus disconnecting the power supply.

The patent literature discloses various earth leakage circuits and protection devices such as the disclosed in EP 0880213. That patent discloses an earth-leakage detection circuit, comprising an earth-leakage current converter for delivering a current which corresponds to the earth-leakage current converter for a circuit to be protected in parallel with the storage element and a comparison circuit for comparing at least one part of the voltage occurring across the storage element with a first threshold value. Such a circuit is also disclosed in German Patent Application 3,807,935.

In the case of the earth-leakage switch disclosed in the abovementioned German Patent Application, a total current converter is used to detect an earth leakage and to generate a current which corresponds to the magnitude of the earth leakage and which is fed to a storage element in the form of a capacitor. Connected in parallel across said capacitor is a load which comprises a voltage divider for obtaining a partial voltage of the voltage enveloped across the capacitor, which partial voltage is compared with a reference voltage. In the case of an unacceptable leakage current, the partial voltage derived from the capacitor will exceed the reference voltage, with the result that a trip mechanism is triggered, by means of which the circuit in which the earth leakage occurs is switched off. This known earth-leakage detection circuit has the disadvantage that, during the charging of the capacitor, the load formed by the voltage divider already absorbs current, as a result of which the charging of the capacitor is delayed and energy will be lost. The object of the invention disclosed in that patent is to provide an earth-leakage detection circuit where a load is provided with a threshold-value circuit, all this is such a way that, if the voltage across the storage element exceeds the first threshold value, a measurement is performed on the current proportional to the earth-leakage current. A trip mechanism responds if the current measurement reveals that the earth-leakage current is too high.

In another example, U.S. Pat. No. 3,737,726 discloses an earth leakage detector for operating circuit interrupting means, comprising a core balance transformer having a taped secondary winding, means to rectify the voltages induced in the secondary winding as a result of an imbalance to give a higher voltage and a lower voltage, a first storage device which is charged to a predetermined voltage by the higher rectified voltage, a first switching device which is energized by the first storage device when charged, a second storage device which is charged by the lower rectified voltage, and a second switching device which is energized when the first switching device is energized to enable the second storage device to discharge into and operate said circuit interrupting means via the second switching means.

In the mining industry, there has been a rapid increase in use of switching power electronics such as variable speed drives (VSD's) for mobile mining machinery, conveyors, pumps, fans and processing plant applications and equipment. Without care in application, variable speed drives, (sometimes also referred to as Variable Voltage, Variable Frequency VVVF or $V^3F$ drives) can lead to power and switching frequency current harmonics and conducted noise with resultant interaction on other equipment, particularly control and protection relays. Concerns have been raised as to the field reliability of protection relays when operating with VSD's giving rise to electrical safety concerns. More specifically, problems have been encountered with relays in relation to detection of earth leakage, earth continuity and earth fault lockout during operation of relays in conjunction with variable speed drives and similar switching power electronic equipment.

These problems fell into two broad categories:
1. Electrical interference with the protection relay intended operation generated by switching power electronics, compromising the relay protection function often leading to nuisance tripping, and;
2. Genuine compromise of the electrical protection scheme, particularly on earth fault limited I-T supply networks where common mode filters typically used with switch power electronics may allow alternate, higher frequency fault current paths not limited by the neutral-earth impedance, potentially resulting in higher touch potentials during fault conditions.

Earth leakage protection relays which use amplitude thresholds or time/current characteristics for mains frequency applications, for I-T networks and hazardous areas are already known in the art. Also known are relays that detect arcing faults in power networks and hazardous step and touch potentials. It is also known to employ frequency domain analysis to identify spectra in signal analyses, and to identify the presence of electrical arcing in power system applications.

Frequency components not related specifically to the power system frequency are a consequence of relatively modern advances in power electronic technology. Prior to the introduction of modern electronics to industrial processes, DC and higher non-power frequency AC signals were unlikely to be present in measurements associated with earth leakage protection. There are a diversity of scenarios where it is possible for signals other than power frequencies and harmonics of the power frequency to enter the safety earth return as a consequence of installed power electronic equipment. Some of these scenarios represent fault conditions: some represent normal operation of the power system.

Common mode earth loop currents are sometimes introduced by specific designs of filtering applied to switching power electronics to minimise conducted and radiated electrical noise, and so ensure electromagnetic compatibility (EMC) with other electrical systems. With reference to an I-T network, common mode loop currents represent potentially uncontrolled power flow in a hazardous environment as the return current divides between the cabled earth return and the physical earth In a ratio inversely proportional to the respective loop Impedances. Once current flows in the physical earth it is no longer managed by normal flameproof controls. Prospective ignition sources are not limited to main frequency.

Similarly, touch potential in an earth fault limited I-T network is implicitly controlled by both the earth fault limiting impedance and pro-active measurement of the cabled earth continuity. This typically relies on a single primary protection star and limiting impedance. Parallel connection of equipment containing common mode EMC filters can be shown to compromise the level of protection afforded by this type of supply system.

Conventional protection relays presently focus on power frequencies (50/60 Hz), on electronically synthesised power frequencies (near DC to approximately 100 Hz), and on harmonics of the power or synthesised power frequency, DC signals, and signals related to the switching, or carrier frequency and its harmonics from switching power electronics (so higher frequencies), are typically filtered out by protection equipment tuned to the power frequency and its harmonics so as to enhance reliability of operation in its intended operation region. This approach regards signals outside of the power frequency and its harmonics as interference. The protection equipment is consequently blinded to current flows that may occur in an earth outside the frequencies conventionally of interest. Reduced bandwidth and filtering in sensing circuits are typically employed to increase robustness against transient or spurious (so higher frequency) signals.

In seeking to increase relay immunity from unnecessary trips, the signal filtering or reduced bandwidth may mask potentially hazardous events that result in sustained DC or higher frequency AC current flow that could cause arcing, damage, personnel injury or death. Although it is possible to measure signals from equipment whilst operating underground it is generally too dangerous and contrary to regulations to use conventional equipment for such measurements. Hazardous (potentially explosive) environments prevent use of conventional electrical equipment to measure DC or higher frequency AC common mode signals. Moreover, the manual use of measurement equipment would not be routine or continuous. In the absence of measurement data, it is not obvious that undesirable currents are flowing, and if left uncontrolled, these currents may be present at hazardous levels.

Similarly, it can be shown that parallel connection of switching power electronics containing common mode filtering to reduce noise emissions, can result in large circulating currents during fault conditions that do not return via the fault limiting impedance. A component of these currents is directly related to the carrier or switching frequency of the power electronics, not the synthesised power frequency or synthesised power frequency harmonics. Protection equipment that cannot resolve higher frequency current (the carrier frequency and its harmonics) due to deliberate sensing bandwidth restrictions will hot detect these fault currents, and may fail to clear a fault condition unless current components within its sensing bandwidth are also generated during the fault.

In the past, DC and higher frequency AC signals have been filtered out from protection relay measurements either by the sensing equipment itself or by dedicated filtering added prior to measurement of the signal., While noise filtration techniques are well known, a simple broadband filter will reject both repetitive and sustained frequencies now of interest as well as spurious noise. Established signal processing techniques allow extraction of signals of interest from noise or transient interference.

The vast majority of existing electrical protection devices are tuned to the fundamental power frequency (50 Hz or 60 Hz) and so are blind to both DC and higher frequency earth leakage currents that can still flow and potentially cause arcing or electrocution without preventative action from the controlling relay. Relays which are designed to detect arcing faults are sensitive to high frequencies but rely on the prior existence of arcing for detection and do not prevent arcing in the first instance. They are also typically tuned to transient currents and not steady state currents, respond to broadband current spectra (not specific harmonics spectra); and do not analyze individual frequency spectra that characterize the harmonics of power frequencies or power electronic switching frequencies.

There remains an ongoing need to improve the known methods and apparatuses for detecting fault and leakage currents in electrical systems to maintain and improve the safety of such systems to accommodate concurrent advances in power electronic technology that is supplied by these systems. More particularly, modern switching electronics and electrical noise suppression techniques typically designed for applications in an MEN system has specific characteristics that can impact on earth leakage current, and so on touch potentials, when installed in an I-T or earth fault limited network.

Interference signals level voltage and current sources are electrically weak so can be dominated by external sources. The presence of other sources makes interpreting low voltage measurement signals more difficult. Interference can manifest as pseudo protection faults, relay misbehaviour or protection irregularities.

In basic operation of VSD's, they rectify the AC mains to regulate a DC link with significant capacitance. Active (switched) power electronic output stage pulse width modulates the DC link voltage to synthesize a variable voltage, variable frequency output waveform. Pilot loop currents represent potentially uncontrolled power flow in a hazardous environment. In an IT network the return current splits between the cabled and physical earths in a ratio relative to the parallel loop impedances. Interference sources driving these loop currents may exceed I.S. limits under certain conditions. Once current is flowing in the physical earth it is in the hazardous environment and outside flameproof controls. Touch potentials and ignition sources are not necessarily limited to 50 Hz and can be just as hazardous at high frequencies.

Initiatives to increase protection relay immunity can mask potentially dangerous situations. Persistent nuisance trips in EC protection may be indicative of HF circulating currents. Manufacturers actively decrease the relay sensitivity to pilot earth noise. Effective techniques have been used to decrease sensitivity such as signal correlation and synchronous filtering error detect/correct communication codes for intelligent terminations. However there is a safety problem with the known designs in that a relay which is made less sensitive to pilot earth noise—i.e. more robust, could mask a condition where interference sources are approaching hazardous levels.

High frequency common mode loop currents are a fundamental consequence of modern drive technology and cannot be eliminated. Mitigation of these currents is a function of controlling relative loop impedance, therefore controlling which path these currents take in returning to the source.

Electrical protection devices suitable for use in hazardous (explosive) environments are heavily regulated by Australian and International Standards with certifications published and maintained by independent authorities. At the time of patent application, certified electrical protection devices with sufficient bandwidth to properly resolve carrier or switching frequency currents generated by power electronic drives are not available for commercial purchase and application in hazardous environments, such as mining.

There is a need to address the aforesaid problems in order to increase safety, particularly though not exclusively in hazardous (potentially explosive) environments by improving safety in earth leakage detection.

Invention

The present invention provides a method for detection of fault currents including noise bandwidth to avoid operational safety problems on earth leakage, earth continuity and earth fault lockout relays used in conjunction with VSD's.

In attempting to ameliorate or eliminate the prior art problems identified above, the present invention seeks to provide a method of measurement, analysis and discrimination of current leakage, components of currents and/or fault currents in electrical systems. The invention further provides methods of detection of DC and higher frequency earth fault currents and leakages in particular though not exclusively in I-T and fault limited networks in hazardous areas such as but not limited to mines. The invention further provides a method for detection of fault and leakage currents in variable speed drives by using noise bandwidth to detect such defects as earth leakage. The present invention further provides a method for analysing the frequency content of ground loop currents peculiar to switching power electronic applications within an I-T supply network to actuate protection equipment, or to provide warning and diagnostic information with reference to anomalous changes in leakage current spectra.

The application of advanced techniques for signal extraction, with subsequent analysis of these signals with reference to the peculiarities of earth leakage protection in an I-T network is novel and unique. According to a preferred embodiment, signal components are analysed which previously existed but were filtered out by existing electrical protection devices. If the protection equipment is not able to observe these signal components, the extended interpretation is not possible. Once signal data is available, the data can be interpreted to indicate an actual fault, a component failure or inadvertent cabling modification which has not resulted in a hazardous condition but may do so in future. The absence of an analysis of the full signal spectrum to identify a hazard is undesirable.

Once the signal information is known, it may be analysed and interpreted with reference to the specific application, and so provide diagnostic information as to the source of an earth leakage. For example, the source of an anomalous change in leakage current may be a VSD operating at a particular fundamental frequency and a unique switching frequency: such information can be used to locate the source of leakage current (perhaps as simple as a single damaged capacitor) in a complex system.

The method according to the invention may be applied at various locations in a network. As an example, if applied at the primary protection star for a fault limited I-T network, it enables the use of acquired data for the detection, monitoring and diagnosis of earth leakage and other faults in machinery operating underground or in a hazardous environment remotely without using conventional measuring tools and analysis within the hazardous area.

It is an object of the present invention to increase protection relay immunity which may mask potentially dangerous situations by providing wide bandwidth measurement equipment required to observe common mode loops, currents and voltages. It is a further object to reduce persistent unwanted relay trips in earth current protection. It is a further object of the invention to provide a method for interpretation of interference signals and ground loop currents which are associated with variable speed drive applications within an I-T supply network.

It is an objective of the invention to provide a method for detection of the presence of DC and/or higher frequency leakage currents to enable initiation of protection equipment to eliminate potential hazards such as arcing or spark ignition in explosive atmospheres, step and touch potential as a hazard to personnel in contact with powered equipment and overheating of electrical components arising from un-modelled power flows.

It is a further objective of the invention to provide in an electrical system, a method for characterising steady state power and switching frequency harmonics for the purpose of providing diagnostic information assisting identification, resolution or repair of equipment generating a fault resulting in activation of electrical protection equipment.

The invention further provides a method for interpretation of data from an open band width so that an observer can determine if a variable speed drive is causing a current leakage.

The invention also provides a relay which is capable of detection and interpretation of data which allows a determination of a source of earth leakage and more particularly earth leakage from a variable speed drive.

In one broad form the present invention comprises:
a relay capable of detecting DC and higher frequency signals that relate to the normal operation of switching power electronics (as opposed to transient electrical noise or a fault condition) for the purpose of analysing earth leakage currents to actuate protection equipment.

In another broad form the present invention comprises:
a method for detection and interpretation of DC and higher frequency signals to enable provision of diagnostic information assisting identification, resolution or repair of equipment generating a leakage current by:
a) sampling an electrical signal generated from a switching electronic apparatus,
b) analysing data from the sampled signal to obtain characteristics that might uniquely identify the source of the signal,
c) comparison of the data characteristics with that from known equipment, with equivalent data taken from the same equipment at another time,
d) interpretation of the sampled signal to ascertain if an electrical hazard is indicated by the data.

The present invention further provides a method of measurement, analysis and determination of leakage and/or fault currents in electrical systems including switching power electronics and enables by reading and interpreting sampled signals the identification of:
a) direct current leakage or fault currents;
b) fundamental and harmonic components of mains frequency currents;
c) fundamental and harmonic components of switching converter currents.

In another broad form of the method aspect the present invention comprises:
a method for detection and interpretation of electrical signals emanating from switching power electronics in an electrical system, to enable the analysis of those signals to determine an earth leakage or fault;
the method comprises the steps of;
a) sampling a signal generated by an electrical apparatus,
b) taking a measurement from one or more measurement points in the electrical system supplying the apparatus,
c) sampling a current or group of currents flowing in the electrical system,
d) conversion of the sampled signals into a data form suitable for analysis;
e) analysing the data to determine its indications of faults or potential faults in connected power electronic equipment;
f) interpreting the data to ascertain if an electrical hazard is indicated According to a preferred embodiment the method comprises the further steps of:
a) activating protection equipment to open circuit the power supply if power frequency or power harmonic leakage currents exceed specified levels and durations
b) activating protection equipment to open circuit the power supply if DC or higher frequency leakage currents are at excessive levels
c) provide diagnostic information as to the characteristics of the equipment likely to have caused the detected leakage signals According to a preferred embodiment, the measurement can be undertaken from one or more observation points in an electrical system, such as a single conductor, a group of conductors, direct measurement of one current in a parallel branch to infer the current flowing in the second parallel branch. Preferably the sampled time domain data is converted into the frequency domain using discrete Fourier transforms, fast Fourier transforms, or a similar established signal processing technique.

According to a preferred embodiment, the interpretation of identified currents in a given assumed operating topology and state enables inference of one or more of the following events and/or parameters:
(i) leakage of direct current into physical or conducted earths;
(ii) leakage of fundamental and harmonic components of mains frequency currents into physical or conducted earths;

(iii) the relative amplitudes of respective power frequency harmonics;
(iv) leakage of fundamental and harmonic switching converter currents into physical or conducted earths;
(v) nominal switching frequency of power converter;
(vi) ineffective or faulty common mode filters on switching converters or equipment supplied by switching converters.

According to a preferred embodiment, the method uses broadband frequency domain analyses and artificial intelligence (including but not limited to pattern recognition) to identify power and switching fundamental frequencies and harmonics in active phase, neutral, earth pilot conductors in electrical power networks.

The present invention provides an alternative to the known prior art and the shortcomings identified. The foregoing and other objects and advantages will appear from the description to follow. In the description reference is made to the accompanying representations, which forms a part hereof, and in which is shown by way of illustration specific embodiments in which the invention may be practiced. These embodiments will be described in sufficient detail to enable those skilled in the art to practice the invention, and it is to be understood that other embodiments may be utilised and that structural changes may be made without departing from the scope of the invention. The following detailed description is, therefore, not to be taken in a limiting sense, and the scope of the present invention is best defined by the appended claims.

DETAILED DESCRIPTION

The present invention will now be described in more detail according to a preferred but non limiting embodiment.

The examples referred to herein are illustrative and are not to be regarded as limiting the scope of the invention. While various embodiments of the invention have been described herein, it will be appreciated that these are capable of modification, and therefore the disclosures herein are not to be construed as limiting of the precise details set forth, but to avail such changes and alterations as fall within the purview of the description. Although the method and apparatus aspects of the invention will be described with reference to their application to I-T networks it will be appreciated that the invention has alternative applications.

The Method of Measurement, Analysis and Interpretation

According to the methodology the first step is to measure the signal and obtain the necessary data for analysis. This is done via digital sampling.

Signal Measurement:

Digital sampling of a current or group of currents is carried out with sufficient bandwidth to properly reconstruct the amplitude and phase of the synthesized power frequency and its harmonics, as well as the fundamental carrier frequency of the switching electronics and the modulation sidebands. The sampling bandwidth includes direct current.

The measurement can be undertaken from one or more observation points in an electrical system:
a) a single conductor (be that ah earth, neutral or individual phase conductor);
b) a group of conductors (simultaneously sample three individual phase conductors, or and neutral (if present) as a current balance to directly measure a residual or leakage current across a three phase bundle);
c) direct measurement of one current in a parallel branch to infer the current flowing in the second parallel branch, with appropriate assumptions regarding relative branch impedances (e.g. measurement of a cabled earth current in combination with a three phase residual current to infer the current flowing in the physical earth).
d) Direct measurement of current in parallel branches using magnitude, phase and frequency content of the measurements to resolve which branch contains the earth fault and/or total earth fault current flowing.

Signal Conversion:

The sampled time domain data is converted into the frequency domain using discrete Fourier transforms, fast Fourier transforms, or a similar established signal processing technique. This conversion yields the magnitude and phase of each frequency component in the sampled data in the frequency domain.

The amplitude spectrum of the frequency domain data generated by the discrete or fast Fourier transform is limited to reject the broadband noise floor, to leave only the significant spectral lines associated with the specific component frequencies of interest.

Signal Analysis

Frequency domain information is used to:

Identify the fundamental power frequency (which may be synthesised by the load through, variable switching electronics or at fixed mains frequency [typically 50/60 Hz]). If a direct current component exists, it is identified. Depending on where the current measurement is made, power frequency and low order harmonics may or may not be present.

If a fundamental power frequency is identified, the power frequency harmonics are identified in magnitude and frequency (typically integer multiples of the fundamental power frequency). If multiple switching electronic modules exist, multiple power frequency and harmonics of that frequency may be detected.

The fundamental switching (or carrier) frequency is identified for loads that include either direct current or variable (synthesised) alternating currents from switching electronics. Where multiple carrier frequencies are detected they are distinguished by identifying sideband components against the fundamental power frequencies identified.

The information can then be used to:
i) activate protection equipment to open circuit the power supply if power frequency or power harmonic leakage currents exceed specified levels and durations.
ii) activate protection equipment to open circuit the power supply if high frequency leakage currents are at excessive levels.
iii) warn that high frequency currents exist at an amplitude that is cause for concern given their location, and provide diagnostic information to assist in locating the source (e.g. a variable speed drive running at 40 Hz fundamental switching at 3.4 kHz is the cause of the signal) to indicate that a marked change has just occurred in the level of signal frequency components detected, which may be indicative of a component failure or unacceptable change in the cabling infrastructure.

According to the method, an inference may be drawn from the signal data obtained that something is wrong (there is a potential, if not an actual fault) such as the presence of currents which should not be present. By providing a relay with an extended bandwidth to include frequency components that are conventionally rejected by protection equipment, and using signal processing to characterise detected signals, the relay is able to provide superior protection and so increased safety as required by increasing deployment of modern switching power electronics into hazardous areas.

It will be further recognised by persons skilled in the art that numerous variations and modifications may be made to the invention without departing from the overall spirit and scope of the invention broadly described herein.

The claims defining the invention are as follows:

1. A method of digital sampling of a current or group of currents in an electrical system having at least one observation point, said at least one observation point comprising, a single conductor or a group of conductors, the method comprising the steps of:
   a) using in said sampling, sufficient bandwidth to reconstruct an amplitude and phase of a synthesized power frequency and its harmonics and a fundamental carrier frequency of switching electronics and modulation sidebands;
   b) measuring relative branch impedances in a cabled earth current in combination with a three phase residual current to infer the current flowing in a physical earth;
   c) converting signals into a frequency domain, wherein frequency domain data uses a signal processing technique selected from discrete Fourier transforms or fast Fourier transforms; wherein the spectrum of said frequency domain data generated by the discrete or fast Fourier transform is limited to reject a broadband noise floor;
   d) converting a signal to yield a magnitude and phase of each frequency component in sampled data in said frequency domain; and
   e) activating protection equipment to open circuit a power supply if power frequency or power harmonic leakage currents exceed specified levels and durations.

2. The method according to claim 1, wherein:
   depending upon where a fundamental power frequency is identified, power frequency harmonics are identified in magnitude and frequency which are integer multiples of the fundamental power frequency.

3. The method of digital sampling according to claim 2, wherein:
   said bandwidth includes direct current.

4. The method of digital sampling according to claim 3, comprising the further step of:
   leaving only significant spectral lines associated with specific component frequencies of interest.

5. The method of digital sampling according to claim 4, comprising the further step of:
   analyzing frequency domain data to determine a fundamental power frequency.

6. The method of digital sampling according to claim 5, wherein:
   analysis of said frequency domain data analysis identifies spectra in signal analyses, and identifies the presence of electrical arcing in power system applications.

7. The method of digital sampling according to claim 6, wherein:
   if a direct current component exists, it is identified.

8. The method of digital sampling according to claim 7, comprising the further step of:
   where, if multiple switching electronic modules exist, multiple power frequency and harmonics of that frequency may be detected.

9. The method of digital sampling according to claim 8, wherein:
   a fundamental switching or carrier frequency is identified for loads that include either direct current or variable synthesized power frequency alternating currents from switching electronics.

10. The method of digital sampling according to claim 9, wherein:
    where multiple carrier frequencies are detected, they are distinguished by identifying sideband components against the fundamental switching or carrier frequency identified.

11. The method of digital sampling according to claim 10, comprising a further step of:
    using measured information to activate protection equipment to open circuit the power supply if high frequency leakage currents are at excessive levels.

12. The method of digital sampling according to claim 11, comprising a further step of:
    using measured information to ascertain that high frequency currents exist at a location and to provide diagnostic information to assist in locating a source of an unwanted current.

13. The method of digital sampling according to claim 12, wherein:
    the single conductor is selected from an earth, neutral or individual phase conductor.

14. The method of digital sampling according to claim 12, comprising the further step of:
    simultaneously sampling three individual phase conductors, to directly measure a residual or leakage current across a three phase bundle.

15. The method of digital sampling according to claim 12, comprising the step of:
    directly measuring one current in a parallel branch to infer a current flowing in a second parallel branch.

16. A method for detection and interpretation of DC and higher frequency signals to enable provision of diagnostic information assisting identification, resolution, or repair of equipment generating a leakage current, according to the steps of:
    a) sampling an electrical signal naturally generated from a switching power electronic loads connected to an electrical system;
    b) analyzing data from the sampled naturally generated signal to obtain data characteristics which uniquely identify a source of the signal;
    c) comparing said data characteristics with data characteristics from known equipment, with equivalent data taken from the known equipment at another time;
    d) interpreting the sampled signal to ascertain if an electrical hazard is indicated by the data; and
    e) activating protection equipment to open circuit a power supply if high frequency signals exceed specified levels and durations.

17. A method for detection and interpretation of electrical signals naturally emanating from switching power electronics operating as connected loads in an electrical system, to enable an analysis of those signals to determine an earth leakage or fault, the method comprising the steps of:
    a) sampling a signal generated by an electrical device;
    b) taking a measurement from at least one measure points in the electrical system supplying said device;
    c) sampling a current or group of currents flowing in the electrical system;
    d) converting sampled signals into a data form suitable for analysis;
    e) analyzing the data to determine its indications of faults or potential faults in connected power electronic equipment;
    f) interpreting the data to ascertain if an electrical hazard is indicated;
    g) a step selected from the group consisting of activating protection equipment to open the power supply if power frequency or power harmonic leakage currents exceed specified levels and durations, and activating protection equipment to open circuit the power supply if DC or higher frequency leakage currents are at excessive levels; and h) providing diagnostic information as to characteristics of the equipment likely to have caused detected leakage signals.

18. The method according to claim 17, wherein:
the measurement is undertaken from at least one observation point in an electrical system.

19. The method according to claim 18, wherein:
the observation point is a single conductor.

20. The method according to claim 19, wherein:
the observation point is a group of conductors.

21. The method according to claim 19, wherein:
the observation point is a point of direct measurement of one current in a parallel branch.

22. The method according to claim 21, wherein:
an observation of direct measurement of one current in a parallel branch allows an inference of the current flowing in a second parallel branch.

23. The method according to claim 22, wherein:
sampled time domain data is converted into a frequency domain using discrete Fourier transforms.

24. The method according to claim 22, wherein:
said sampled time domain data is converted into a frequency domain using fast Fourier transforms.

25. The method according to claim 23, wherein:
said sampled time domain data is converted into a frequency domain using a signal processing technique.

26. The method according to claim 25, wherein:
interpretation of identified currents in a given assumed operating topology and state enables inference of at least one of the following events and/or parameters:

(i) leakage of direct current into physical or conducted earths;

(ii) leakage of fundamental and harmonic components of mains frequency currents into physical or conducted earths;

(iii) relative amplitudes of respective power frequency harmonics;

(iv) leakage of fundamental and harmonic switching converter currents into physical or conducted earths;

(v) nominal switching frequency of power converter; and (vi) ineffective or faulty common mode filters on switching converters or equipment supplied by switching converters.

* * * * *